(12) United States Patent
Tian et al.

(10) Patent No.: US 10,909,287 B2
(45) Date of Patent: Feb. 2, 2021

(54) METHODS, SYSTEMS AND APPARATUS TO IMPROVE FPGA PIPELINE EMULATION EFFICIENCY ON CPUS

(71) Applicant: Intel Corporation, Santa Clara, CA (US)

(72) Inventors: Xinmin Tian, Fremont, CA (US); Geoff Lowney, Hudson, MA (US)

(73) Assignee: INTEL CORPORATION, Santa Clara, CA (US)

( * ) Notice: Subject to any disclaimer, the term of this patent is extended or adjusted under 35 U.S.C. 154(b) by 659 days.

(21) Appl. No.: 15/636,265

(22) Filed: Jun. 28, 2017

(65) Prior Publication Data
US 2019/0005175 A1 Jan. 3, 2019

(51) Int. Cl.
*G06F 30/331* (2020.01)
(52) U.S. Cl.
CPC .................. *G06F 30/331* (2020.01)
(58) Field of Classification Search
None
See application file for complete search history.

(56) References Cited

U.S. PATENT DOCUMENTS 8,549,501 B2 * 10/2013 Eichenberger ........ G06F 8/4452
717/150

OTHER PUBLICATIONS

Coutinho, Jose Gabriel F et al., "Optimizing and Adapting High-Level Hardware Designs", 2002, IEEE. (Year: 2002).*
(Continued)

*Primary Examiner* — Cedric Johnson
(74) *Attorney, Agent, or Firm* — Hanley Flight & Zimmerman, LLC

(57) ABSTRACT

Methods, apparatus, systems and articles of manufacture are disclosed to improve FPGA pipeline emulation efficiency on CPUs. An example disclosed apparatus includes a loop detector to identify a register shift loop in field programmable gate array (FPGA) code, an unroller to shift and store pipeline stages in the register shift loop to a temporary unroll array, an intermediate canceller to cancel out intermediate load and store values of the temporary unroll array to retain last shifted values of the pipeline stages, and a propagator to improve emulation efficiency of the FPGA code by generating a scalar loop of the retained last shifted values for a vectorization input.

21 Claims, 10 Drawing Sheets

(56) References Cited

OTHER PUBLICATIONS

Weinhardt, Markus et al., "Pipeline Vectorization", Feb. 2001, IEEE Transactions on Computer-Aided Design of Integrated Circuits and Systems, vol. 20, No. 2, IEEE. (Year: 2001).*
Weinhardt, Markus et al., "Memory Access Optimization and RAM Inference for Pipeline Vectorization", 1999, Springer Verlag. (Year: 1999).*
Hagiescu, Andrei et al., "Co-Synthesis of FPGA-Based Application-Specific Floating Point SIMD Accelerators", Feb. 27-Mar. 1, 2011, FPGA'11, ACM. (Year: 2011).*
Adams, "FPGA or GPU?—The evolutions Continues", published on Sep. 16, 2014, retrieved from the web http://mil-embedded.com/articles/fpga-gpu-evolution-continues/ on Jun. 13, 2017, 6 pages.
Andraka, "FPGAs cut power with 'pipeline'", published on Aug. 7, 2000, retrieved from the web http://www.eetimes.com/document.asp?doc_id=1214855 on Jun. 12, 2017, 4 pages.
"SIMD", retrived from Wikipedia https://en.wikipedia.org'wiki/SIMD, Mar. 16, 2017, 6 pages.
"Software Pipelining", Feb. 27, 2017, retrived from Wikipedia https://en.wikipedia.org/w/index.phptitle=Software_pipelining&oldid=767681694, 5 pages.

* cited by examiner

```
#define II_CYCLES 11
float FPGAPipelinedLoop (
  float *restrict a, int n)

{
  int s, k;
  float register_buf[II_CYCLES + 1];

// Pipeline buffer initialization loop
  for (s = 0; s < II_CYCLES; s++)
  {
    register_buf[s] = 1.0f;
  }

// Fully pipelined loop nest
  for (k = 0; k < n; k++)
  {
  // Computation code for each stage
    register_buf[II_CYCLES] = register_buf[0] * a[k];

// Register buffer shifting inner loop
    for (s = 0; s < II_CYCLES; s++)
    {
      register_buf[s] = register_buf[s+1];
    }
  }

// Pipeline drain out loop
  for (int s = 0; s < II_CYCLES; s++)
  {
    result *= register_buf[s];
  }
  return result;
}
```

Virtual Unroll

302 — for (k = 0; k < II_CYCLES; k++)
{
buf[k] = buf[k+1]
}

=>
  buf[0] = buf[1]
  buf[1] = buf[2]  } 306
  buf[2] = buf[3]

304 — ....
....
buf[II_CYCLES – 1] = buf[II_CYCLES]

Copy Propagation

```
tmp = register_buf[0];
for (k = 0; k < n; k++)
{
 tmp = tmp * a[k];
} register_buf[0] = tmp;
```

```
#define II_CYCLES 11
float FPGAPipelinedLoop (
    float *restrict a, int n)

{
  int s, k;
  float register_buf[II_CYCLES + 1];

// Pipeline buffer initialization loop
  for (s = 0; s < II_CYCLES; s++)
  {
    register_buf[s] = 1.0f;
  }
                    `-- 506        `-- 508
// Fully pipelined loop nest
for (k = 0; k < n; k++)
{
// Computation code for each stage
  register_buf[II_CYCLES] =
      register_buf[0] * a[k];

// Register buffer shifting inner loop
  for (s = 0; s < II_CYCLES; s++)
    {
      register_buf[s] = register_buf[s+1];
    }
}                   `-- 502        `-- 504
// Pipeline drain out loop
  for (int s = 0; s < II_CYCLES; s++)
  {
    result *= register_buf[s];
  }               `-- 510
return result;                     `-- 512
}
```

500 ⟶

```
#define II_CYCLES 11
float FPGAPipelinedLoop (
    float *restrict a, int n)
{
  int k;
  float register_buf[II_CYCLES + 1], tmp;

// One element of register_buf initialization register_buf[0] = 1.0f;

// SIMD loop converted from
// pipeline loop nest
  tmp = register_buf[0];
  for (k = 0; k < n; k++)
  {
    // Computation code
    tmp = tmp * a[k];
  } register_buf[0] = tmp;
                                    `-- 514
Result *= register_buf[0];
Return result;
}
```

FIG. 5

```
// Scalar code
  for (k = 0; k < 16; k++) // 1 iteration processes 1 element
{
  a[k] = a[k] + 1;
}
// SIMD code
  for (k = 0; k < 16; k+=4)
{
  vector_register = vector_load(a[k:4]); // load a[k], a[k+1], a[k+3]; 4 elements using 1   instruction
  vector_add, vector_register, 1;  // simd ADD a[k]+1, a[k+1]+1, a[k+2]+1, a[k+3]+1
  vector_store(a[k:4], vector_register);  // store values in the vector register to a[k], a[k+1], a[k+2], a[k+3]
}
```

METHODS, SYSTEMS AND APPARATUS TO IMPROVE FPGA PIPELINE EMULATION EFFICIENCY ON CPUS

FIELD OF THE DISCLOSURE

This disclosure relates generally to emulating field-programmable gate array (FPGA) code, and, more particularly, to methods, systems and apparatus to improve FPGA pipeline emulation efficiency on central processing units (CPUs).

BACKGROUND

In recent years, field-programmable gate arrays (FPGAs) have been utilized to take advantage of relatively wide inputs when compared to input widths of general purpose central processing units (CPUs). Generally speaking, for applications that process large amounts of data, such data flow is typically limited by a bus width. In view of CPU bus widths of, for example, 16-bit, 32-bit, 64-bit, etc., FPGAs facilitate throughput advantages on a per-cycle basis that general purpose CPUs cannot achieve.

BRIEF DESCRIPTION OF THE DRAWINGS

FIG. 1 is an illustration of example code of a field programmable gate array (FPGA) pipelined loop nest constructed in accordance with the teachings of this disclosure to improve FPGA pipeline emulation efficiency on central processing units (CPUs).

FIG. 3 is an illustration of an example virtual unroll of a register buffer shifting inner loop of the example code of the FPGA pipelined loop nest of FIG. 1.

FIG. 4 is an illustration of example copy propagation code generated by an example single input multiple data (SIMD) code generator of FIG. 2 to improve FPGA pipeline emulation efficiency on CPUs.

FIG. 5 is an illustration of an example central processing unit (CPU) SIMD loop generated by the example SIMD code generator of FIG. 2 to improve FPGA pipeline emulation efficiency on CPUs.

FIG. 6 is an illustration of example vectorization code constructed in accordance with the teachings of this disclosure to improve FPGA pipeline emulation efficiency on CPUs.

Figure 2:
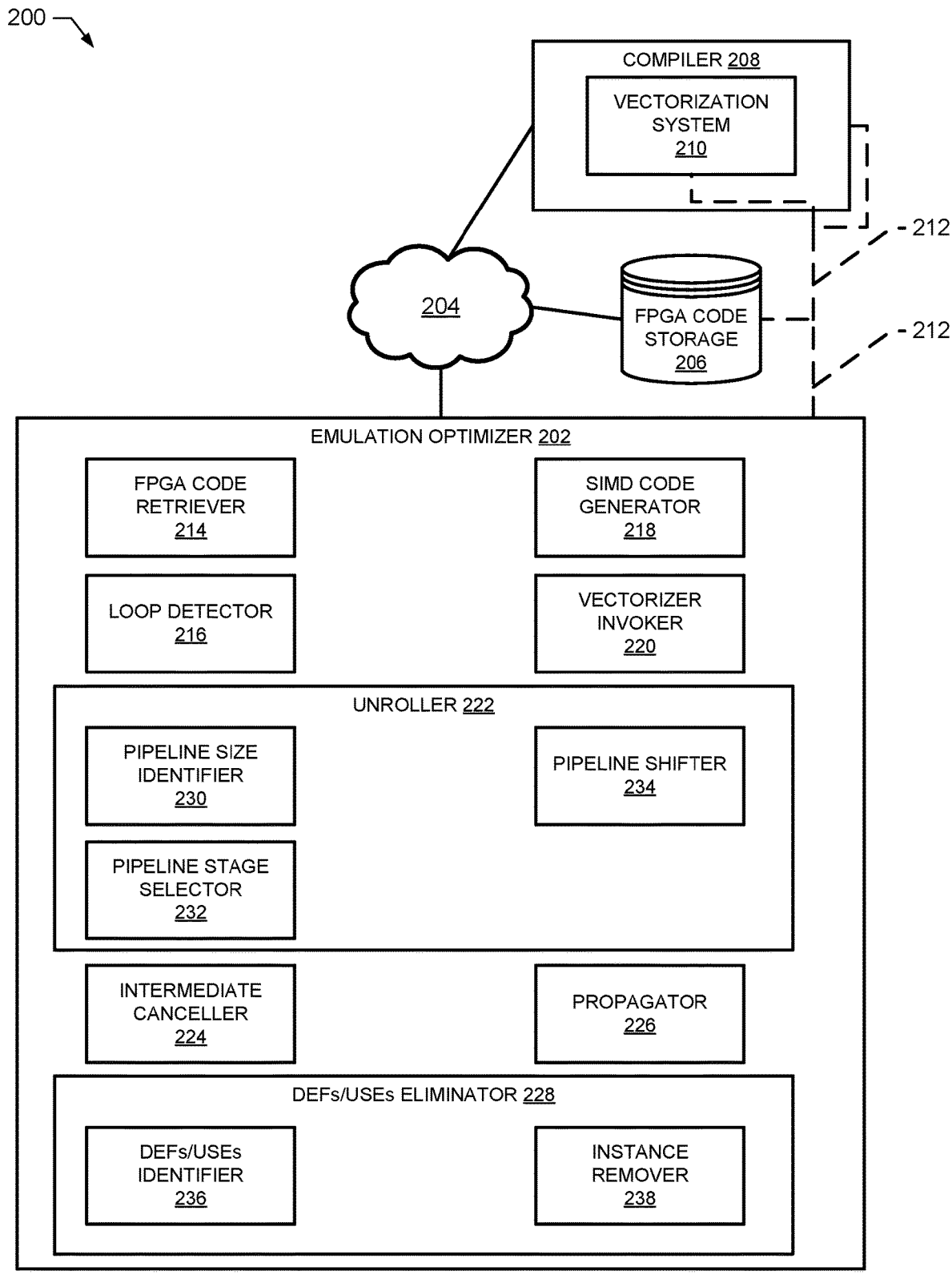
FIG. 2 is a schematic illustration of an example emulation optimization environment constructed in accordance with the teachings of this disclosure to improve FPGA pipeline emulation efficiency on CPUs.

The figures are not to scale.

DETAILED DESCRIPTION

Data intensive applications, such as applications related to autonomous driving, are typically executed and/or otherwise processed with field-programmable gate arrays (FPGAs) to take advantage of specialized functionalities, die size benefits, performance capabilities and power consumption requirements. FPGAs are integrated circuits that may be customized by a client (and/or an end-user of the client) in the field to perform a particular purpose/task. FPGAs may include any number of logic gates (e.g., AND gates, XOR gates, etc.), memory elements, inputs, outputs, comparators, analog to digital converters, digital to analog converters and/or bidirectional data buses. Additionally, the FPGA is programmatically re-configured at the hardware level (as opposed to a central processing unit (CPU) that is programmable by software, but its underlying physical circuitry does not change). As such, FPGAs may be restructured in the field (e.g., by an end user after leaving a manufacturing facility) to exhibit hardware circuits specifically designed to perform specific tasks.

As described above, FPGAs are circuits (e.g., silicon based) that can be programmed in the field to function as a special purpose processor. While FPGAs may be similar to Application Specific Integrated Circuits (ASICs), they differ in important ways. For instance, FPGAs may be programmed after leaving the manufacturing facility (e.g., in the field by an end user) one or more times. In contrast, ASICs are specifically designed to include specific hardware circuitry to perform one or more functions and lack an ability for reconfiguration in the field. FPGAs are, by definition, more flexible and can be designed in the field to perform tasks of interest. Unlike general purpose CPUs (which may be programmed in the field by software or firmware), programming and/or otherwise configuring an FPGA involves creating physical hardware circuits in the FPGA. Hardware circuits are often faster than software routines designed to perform the same function as the corresponding circuitry. Thus, the FPGA can be field programmed to perform specific functions with hardware circuits more efficiently than a CPU can perform the same function via software.

Before FPGAs can perform their desired task(s), they are configured. While FPGA configuration is sometimes referred to as "burning" or "FPGA generation," some FPGAs are volatile devices that do not retain the configuration settings after a power-off condition. In some examples, FPGAs are non-volatile devices that retain configuration settings after a power-off condition occurs. In either volatile or non-volatile examples, FPGA configuration is accomplished with software instructions referred to as an FPGA pipeline loop nest (sometimes referred to as a "pipeline loop," a "pipeline loop nest," "pipeline loop code," or a "loop nest"). In some examples, FPGA configuration requires several hours of time to complete.

During a process of FPGA design, which occurs prior to FPGA configuration (in which FPGA hardware is "burned") one or more iterations of the software instructions associated with the pipeline loop may be altered and/or otherwise changed to accommodate for feature changes and/or debugging efforts. As such, in the event any change is applied to the pipeline loop code, several hours of time are required to evaluate the effects of the code modifications before such changes can be evaluated during FPGA execution of the modified pipeline loop code. Such development delay during FPGA design is unacceptable to some target application environments. In an effort to reduce an amount of time associated with FPGA design, including FPGA feature additions, FPGA feature changes, and/or FPGA debugging, the pipeline code may be emulated by a CPU, thereby saving an amount of time typically associated with the FPGA configuration (e.g., "burning"). However, while the pipeline code may be emulated by a CPU, because the pipeline code is specifically written and/or otherwise designed for target FPGA architectures, a resulting emulation performance suffers and/or is otherwise not optimized. For example, Table 1 below illustrates emulation performance for three separate CPUs for an input array (frame size) of 1024×1024 elements.

TABLE 1

| CPU Type | Emulation Duration for Pipeline Loop |
|---|---|
| SSE.4.2 | 2.442 mSec. |
| AVX2 | 2.413 mSec. |
| AVX512 | 2.416 mSec. |

In the illustrated example of Table 1, a first example CPU is the Intel® SSE.4.2 that can facilitate 4-way parallelism, a second example CPU is the Intel® AVX2 that can facilitate 8-way parallelism, and a third example CPU is the Intel® AVX512 that can facilitate 16-way parallelism. Generally speaking, the example CPU types of Table 1 are listed in an order of improving capability, with the example SSE.4.2 being the least capable CPU relative to the example AVX512 CPU. Worth noting is that despite generational improvements in the example processor types of Table 1, emulation of the pipeline code does not exhibit a corresponding temporal improvement. Stated differently, FPGA pipeline code is not optimized to emulate well on non-FPGA devices, such as the example CPU types of Table 1.

Examples disclosed herein reduce a cycle time of FPGA design by reducing or eliminating instances of FPGA configuration during iterative modifications of the pipeline code. Additionally, examples disclosed herein transform multiple stage pipelines of the pipeline code to a single-stage pipeline to enable code vectorization, thereby improving emulation execution time. To illustrate, example Table 2 includes the same CPUs listed in the illustrated example of Table 1.

TABLE 2

| CPU Type | Emulation Duration for Pipeline Loop | Emulation Duration for Vectorized Code |
|---|---|---|
| SSE.4.2 | 2.442 mSec | 2.118 mSec |
| AVX2 | 2.413 mSec | 1.077 mSec |
| AVX512 | 2.416 mSec | 0.884 mSec |

In the illustrated example of Table 2, a column of emulation duration is shown for vectorized code generated by examples disclosed herein. As described in further detail below, multiple-way parallelism architectures of example CPUs can substantially improve emulation durations, in which the example Intel® AVX2 CPU exhibits a performance improvement of 2.24, and the example Intel® AVX512 exhibits a performance improvement of 2.73. For the sake of illustration, in the event a target FPGA design is emulated with one million frames of size 1024×1024, then examples disclosed herein enable an emulation time savings of approximately 25 minutes.

FIG. 1 illustrates an example FPGA pipelined loop nest 100 (as described above, sometimes referred to as a "pipeline loop," a "pipeline loop nest," "pipeline loop code," or a "loop nest"). In the illustrated example of FIG. 1, the pipeline loop code 100 is defined to include twelve (12) pipeline stages (zero-based definition) 102, in which each stage must be initialized in a pipeline buffer initialization loop 104. The example pipeline loop code 100 also includes a double-nested for-loop 106, in which an example k-loop 108 computes each stage of a pipeline, and an example s-loop 110 (sometimes referred to herein as a register buffer shifting loop) performs register buffer shifting within each pipeline stage. The illustrated example of FIG. 1 also includes a pipeline drain-out loop 112 (sometimes referred to herein as a "finalization loop") to prepare the pipeline output for the multiple pipeline stages (e.g., twelve stages, in this example).

While the example FPGA pipelined loop nest 100 of FIG. 1 is code that targets an FPGA hardware architecture, compilers are able to compile the example pipeline loop code 100 to execute on CPUs, such as general purpose CPUs and/or the example CPUs illustrated in tables 1 and 2. However, relatively poor emulation performance by target CPUs is caused by, in part, instances of pipeline stage initialization 104, pipeline stage shifting 106, and pipeline drain-out procedures 112 (finalization loop) for target hardware (e.g., CPUs) that does not process input data in a manner similar to FPGAs. Substantial computational overhead results from the for-loops that implement the example pipeline stage initialization 104, the example pipeline stage shifting 106, and the example pipeline drain-out procedures 112. Additionally, substantial overhead results from single statement assignment (SSA) definition (DEF) and uses (USE) instances within those for-loops. In some examples, SSA DEFs and/or USEs are referred to as Use-Definition chains or Definition-Use chains. Further, substantial overhead results from memory load instances and memory store instances that occur during the example pipeline stage shifting 106. As described in further detail below, examples disclosed herein transform the example pipeline loop code 100 to a single stage pipeline, thereby reducing such overhead to achieve the example emulation improvement durations illustrated in the example of Table 2.

FIG. 2 illustrates an example emulation optimization environment 200. In the illustrated example of FIG. 2, the optimization environment 200 includes an example emulation optimizer 202 communicatively connected to an example network 204, which is further communicatively connected to an example FPGA code storage 206 and an example compiler 208. In some examples, the example compiler 208 includes an example vectorization system 210. While the illustrated example of FIG. 2 illustrates the example FPGA code storage 206, the example compiler 208 and the example vectorization system 210 external to the example emulation optimizer 202, in some examples these components are integrated within the example emulation optimizer 202. In some examples, the emulation optimizer 202 is integrated within the example compiler 208. In some examples, the emulation optimizer 202 is communicatively connected to the example FPGA code storage 206, the compiler 208 and/or the example vectorization system 210 via a bus 212.

In the illustrated example of FIG. 2, the emulation optimizer 202 includes an example FPGA code retriever 214, an example loop detector 216, an example single instruction multiple data (SIMD) code generator 218, an example vectorizer invoker 220, an example unroller 222, an example intermediate canceller 224, an example propagator 226, and an example DEFs/USEs eliminator 228. In the illustrated example of FIG. 2, the unroller 222 includes an example pipeline size identifier 230, an example pipeline stage selector 232, and an example pipeline shifter 234. In the illustrated example of FIG. 2, the DEFs/USEs eliminator 228 includes an example DEFs/USEs identifier 236 and an example instance remover 238.

In operation, the example FPGA code retriever 214 receives and/or otherwise retrieves pipeline loop code, such as the example pipeline loop code 100 of FIG. 1. The example loop detector 216 evaluates and/or otherwise parses the example pipeline loop code to identify a for-loop, such as the example pipeline buffer initialization loop 104 of FIG. 1. Additionally, the example loop detector 216 determines whether the identified for-loop is nested and, if so, designates the identified for-loop as a pipelined loop nest. However, in the event the example loop detector 216 determines that the identified for-loop is not nested, then the example loop detector 216 identifies the loop as one of an initialization loop or a finalization loop. In some examples, the loop detector 216 identifies a first instance of a non-nested for-loop as the initialization loop (e.g., the example pipeline stage initialization 104 of FIG. 1), and a second instance of a non-nested for-loop as the finalization loop (e.g., the example finalization loop 112 of FIG. 1).

After the example loop detector 216 identifies all for-loop instances of the example pipeline loop code 100, it further analyzes and/or otherwise parses the identified nested loop to identify a register shift inner loop, such as the example s-loop 110 of FIG. 1. The example unroller 222 unrolls the register shift loop based on a size of the pipeline to cancel out any intermediate loads and stores of the example pipeline loop code 100. In particular, the example pipeline size identifier 230 identifies a pipeline size based on an outer-loop of the nested for-loop that is defined by the example pipeline stage definition 102 of FIG. 1. Based on this detected size, the example pipeline shifter 234 generates a temporary unroll array, and the example pipeline stage selector 232 selects a pipeline stage. The example pipeline shifter 234 loads a corresponding register element and shifts and stores the corresponding element value in a shift-direction of the example pipeline loop code 100. For instance, the example register buffer shifting loop 110 of FIG. 1 is indicative of left-shifting (register_buf[s]=register_buf[s+1]). However, examples are not limited to left-shifting.

In the event the example pipeline stage selector 232 determines that the selected pipeline stage includes one or more additional array elements to shift, the example pipeline shifter 234 loads the next available register element and repeats the shifting operation on that next element. On the other hand, in the event the example pipeline stage selector 232 determines that the selected pipeline stage has completed shifting the register elements, then the example pipeline stage selector 232 determines if there are one or more additional pipeline stages, each of which includes a need for register shifting. If so, then the example pipeline stage selector 232 selects a next available pipeline stage (e.g., a next one of the twelve stages of the example pipeline loop code 100).

After all loop shifting for each pipeline stage has been completed, each element of the temporary unroll array includes a result of shifting for each pipeline stage. To illustrate, FIG. 3 includes an example virtual unroll 300 of the register buffer shifting inner loop 110 of FIG. 1. In the illustrated example of FIG. 3, the example pipeline shifter 234 has generated the temporary unroll array as buf[k] 302. The example virtual unroll 300 of FIG. 3 shifts through buffer elements in a manner that retains only the last element in the shifting instructions of the example buffer shifting inner loop 110 of FIG. 1. Generally speaking, FPGAs require loops to facilitate parallel execution of the pipelines, but because the target CPU environment for emulation does not utilize FPGAs, the virtual unrolling 300 of FIG. 3 removes the intermediate values of the shifting to create a scalar end-result. In doing so, resulting transformed target code for the CPU environment is simplified by removing the associated loops, the associated DEFs and USEs and memory allocation intermediate representation (IR) code associated therewith.

The example intermediate canceller 224 cancels out intermediate loads and stores 306 of the example virtual unrolling 300 to retain a last-shifted value 304. The example propagator 226 generates code for the target CPU to propagate the retained values as a scalar loop to be used as input for the example vectorization system 210. In some examples, the example SIMD code generator 218 assists and/or otherwise generates the code for the target CPU, as described in further detail below. FIG. 4 illustrates example copy propagation code 400 generated by the example SIMD code generator 218. In the illustrated example of FIG. 4, the SIMD code generator 218 converts the multiple stages of the FPGA pipeline into a single-stage pipeline as a scalar format, which is a format that can be accepted as an input to vectorization systems, such as the example vectorization system 210 of FIG. 2. In the example scalar code format of FIG. 4, the vectorization system 210 is able to subdivide element computations based on the processor instruction set capabilities of the target CPU, such as those that can perform 4-way, 8-way, 16-way, etc., parallelization.

The example DEFs/USEs eliminator 228 analyzes the example pipeline loop code 100 to eliminate unnecessary SSA DEFs and USEs. In particular, the example loop detector 216 locates the register shift inner loop 110, which includes data-dependency parameters that are candidates for removal. The example DEFs/USEs identifier 236 identifies DEFs and USEs associated with the register shift loop 110 so that those same DEFs and USEs can be identified in other portions of the example pipeline loop code 100. Stated differently, because the computationally expensive register shift loop 110 is to be removed from transformed code for the target CPU architecture, any DEFs and USEs of that register shift loop 110 can also be removed from any other portions of the example pipeline loop code.

The example SIMD code generator 218 generates a CPU SIMD loop based on the simplifications applied to the example pipeline loop code 100 described above. FIG. 5 illustrates an example CPU SIMD loop 500 generated by the example SIMD code generator 218 that is shown adjacent to the example pipeline loop code 100 of FIG. 1. Stated differently, the example CPU SIMD loop 500 represents results of transforming the pipeline loop code 100 (i.e., a multiple stage pipeline) to a single stage pipeline that generates a scalar output to enable vectorization.

In the illustrated example of FIG. 5, the example SIMD code generator 218 generates simplified code 500 having one or more optimizations when compared to the pipeline loop code 100. For example, as described above, the example loop detector 216 identified the register shift inner loop 110, which exhibits the most significant computational burden for a CPU target platform. Within the register shift inner loop 110, the example DEFs/USEs identifier 236 identified an example USE 502 (s=0), and an example DEF 504 (s<II_CYCLES). Additionally, the example DEFs/USEs remover 238 removed those DEF and USE instances, and the example SIMD code generator 218 generated corresponding simplified SIMD code without those instances in the example simplified code 500 of FIG. 5. In effect, removal of such DEF and USE instances also eliminates a corresponding for-loop in the example simplified code 500 of FIG. 5. Similarly, instances of the identified initialization loop DEF 506, initialization loop USE 508, pipeline drain-out loop DEF 510, and pipeline drain-out loop USE 512 are also removed, thereby improving the computational efficiency of the example simplified code 500 of FIG. 5.

The example vectorizer invoker 220 invokes the example vectorization system 210 and provides a scalar representation of an SIMD loop 514 thereto. As described above, vectorization seeks to take advantage of CPU parallelism capabilities, but such capabilities cannot be achieved to an optimum degree if the input to the vectorizer contains loops for a target FPGA platform. Such inefficiencies are illustrated above in example Table 2. To illustrate, consider an example target CPU (e.g., a CPU with a parallel processing instruction set) capable of 4-way parallelization. FIG. 6 illustrates example vectorization code 600. In the illustrated example of FIG. 6, scalar code 602 includes a similar scalar format as the example SIMD loop 514 of FIG. 5 that was generated by the example SIMD code generator. The example scalar code 602 of FIG. 6 includes a scalar for-loop in which one iteration processes one element of the loop. In particular, each of the sixteen (16) iterations of the example scalar code 602 processes one element of the array a[k].

The example vectorization invoker 220 provides the example scalar code 602 to a vectorization system, which is outside the scope of this disclosure, but described herein to illustrate how the transformation of the example multiple stage pipeline to a single stage pipeline improves emulation performance. In the illustrated example of FIG. 6, the vectorization system, such as the example vectorization system 210 of FIG. 2, transforms the scalar code 602 to SIMD code 604. In some examples, a compiler, such as the example compiler 208 of FIG. 2, identifies the parallelization capabilities of the target (e.g., an -xSSE4.2, an -xCore-AVX2, an -xCore-AVX512, etc.). The example compiler breaks-up the input elements to accommodate to the parallelism capabilities of the target. In this example, if the target can accommodate 4-way parallelization, then the example compiler 208 breaks-up the for-loop into size portions of four (4) elements 606. In effect, the SIMD code processes four (4) elements for each iteration to achieve the emulation duration benefits shown in Table 2.

While an example manner of implementing the emulation optimization environment 200 of FIG. 2 is illustrated in FIGS. 1-6, one or more of the elements, processes and/or devices illustrated in FIGS. 1-6 may be combined, divided, re-arranged, omitted, eliminated and/or implemented in any other way. Further, the example FPGA code retriever 214, the example loop detector 216, the example SIMD code generator 218, the example vectorizer invoker 220, the example unroller 222, the example pipeline size identifier 230, the example pipeline stage selector 232, the example pipeline shifter 234, the example intermediate canceller 224, the example propagator 226, the example DEFs/USEs eliminator 228, the example DEFs/USEs identifier 236, the example instance remover 238, the example compiler 208, the example vectorization system 210 and/or, more generally, the example emulation optimizer 202 of FIG. 2 may be implemented by hardware, software, firmware and/or any combination of hardware, software and/or firmware. Thus, for example, any of the example the example FPGA code retriever 214, the example loop detector 216, the example SIMD code generator 218, the example vectorizer invoker 220, the example unroller 222, the example pipeline size identifier 230, the example pipeline stage selector 232, the example pipeline shifter 234, the example intermediate canceller 224, the example propagator 226, the example DEFs/USEs eliminator 228, the example DEFs/USEs identifier 236, the example instance remover 238, the example compiler 208, the example vectorization system 210 and/or, more generally, the example emulation optimizer 202 of FIG. 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example FPGA code retriever 214, the example loop detector 216, the example SIMD code generator 218, the example vectorizer invoker 220, the example unroller 222, the example pipeline size identifier 230, the example pipeline stage selector 232, the example pipeline shifter 234, the example intermediate canceller 224, the example propagator 226, the example DEFs/USEs eliminator 228, the example DEFs/USEs identifier 236, the example instance remover 238, the example compiler 208, the example vectorization system 210 and/or, more generally, the example emulation optimizer 202 of FIG. 2 is/are hereby expressly defined to include a non-transitory computer readable storage device or storage disk such as a memory, a digital versatile disk (DVD), a compact disk (CD), a Blu-ray disk, etc. including the software and/or firmware. Further still, the example emulation optimizer 202 of FIG. 2 may include one or more elements, processes and/or devices in addition to, or instead of, those illustrated in FIGS. 1-6, and/or may include more than one of any or all of the illustrated elements, processes and devices.

Figure 7:
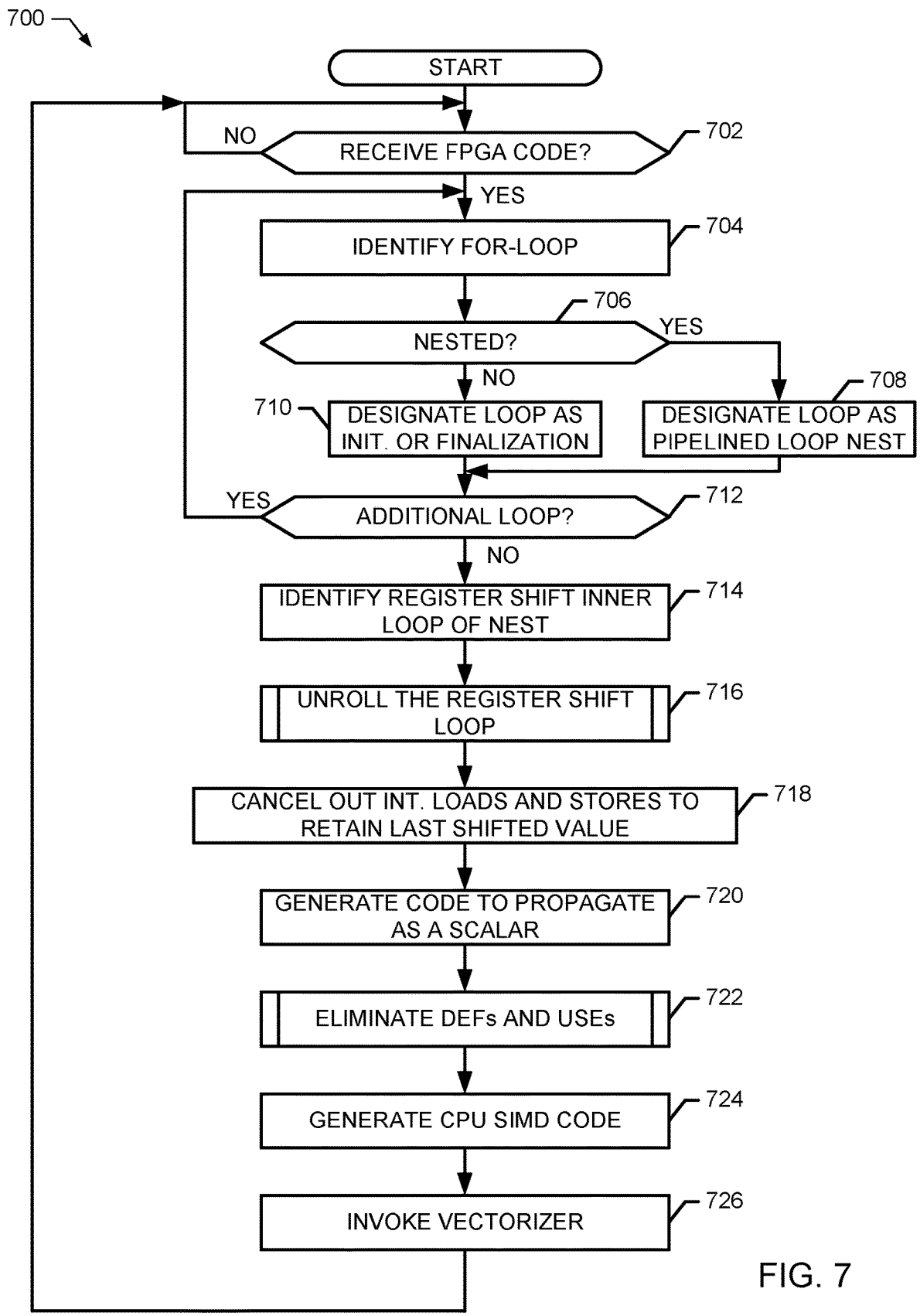
FIGS. 7-9 are flowcharts representative of example machine readable instructions that may be executed to implement the example emulation optimization environment of FIG. 2 to improve FPGA pipeline emulation efficiency on CPUs.
Figure 8:
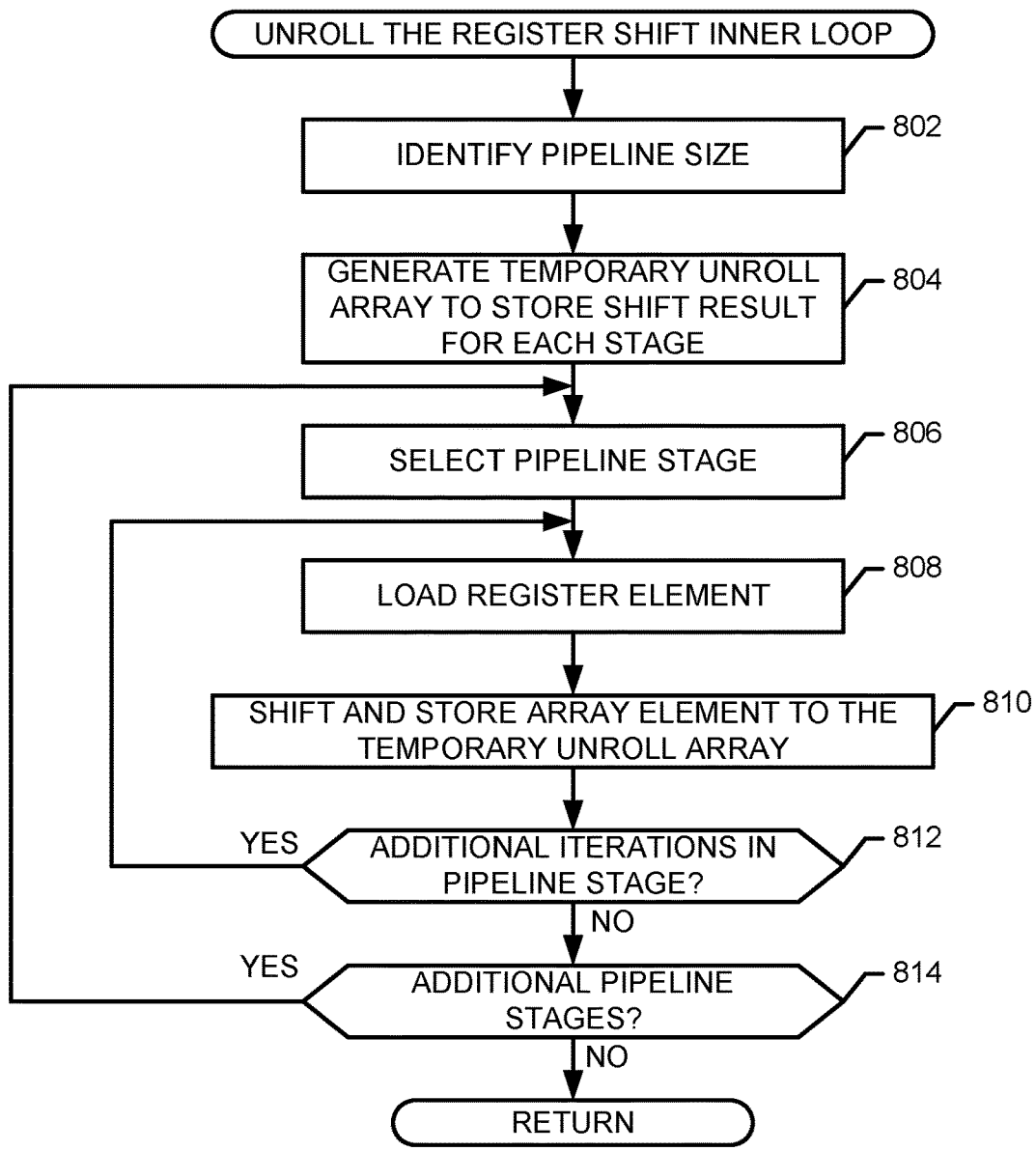
Figure 9:
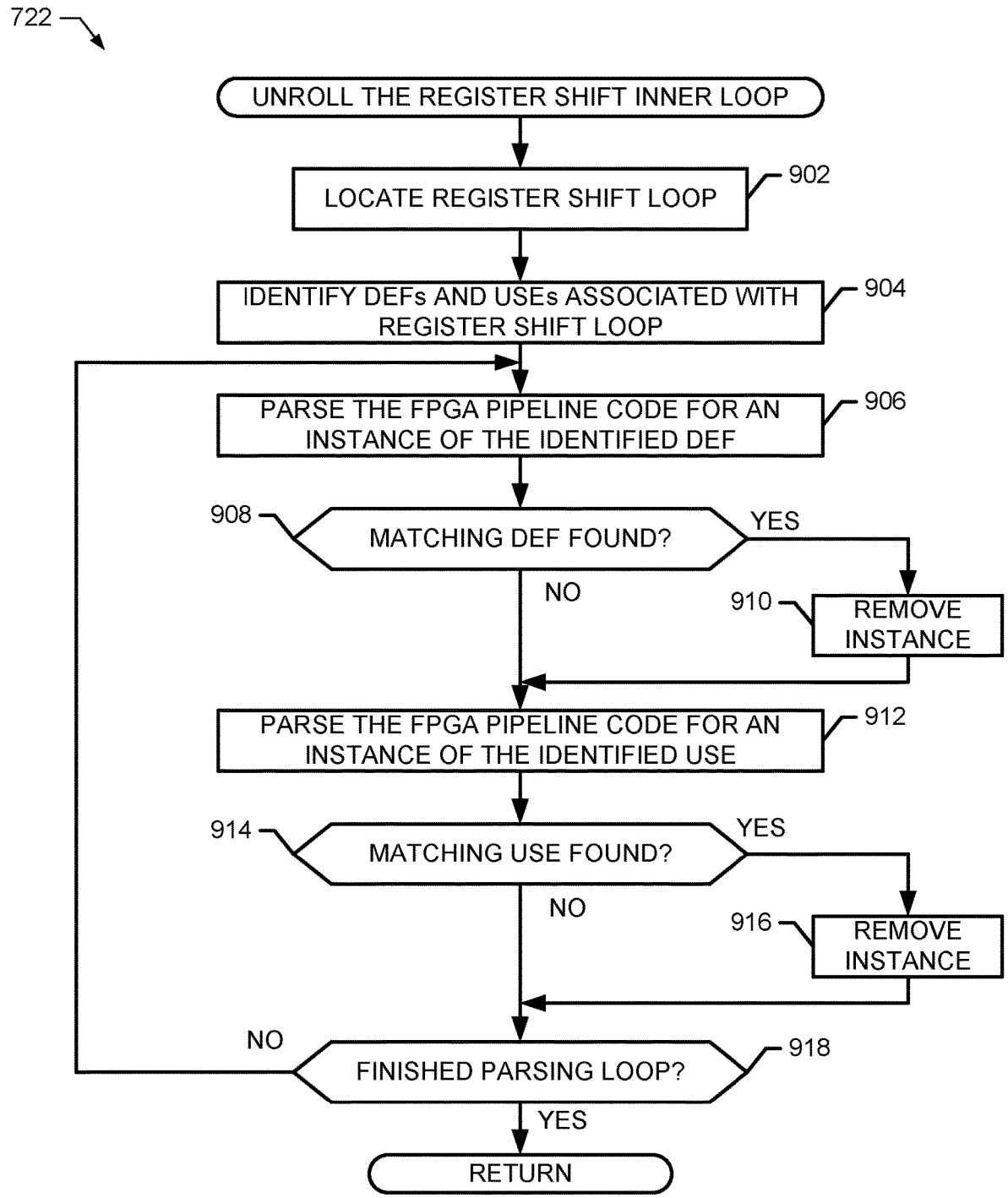

Flowcharts representative of example machine readable instructions for implementing the emulation optimization system 200 of FIG. 2 are shown in FIGS. 7-9. In these examples, the machine readable instructions comprise a program for execution by a processor such as the processor 1012 shown in the example processor platform 1000 discussed below in connection with FIG. 10. The programs may be embodied in software stored on a non-transitory computer readable storage medium such as a CD-ROM, a floppy disk, a hard drive, a digital versatile disk (DVD), a Blu-ray disk, or a memory associated with the processor 1012, but the entire program(s) and/or parts thereof could alternatively be executed by a device other than the processor 1012 and/or embodied in firmware or dedicated hardware. Further, although the example program(s) is/are described with reference to the flowcharts illustrated in FIGS. 7-9, many other methods of implementing the example emulation optimization system 200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 7-9 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

The program 700 of FIG. 7 begins at block 702 where the example FPGA code retriever 214 determines if FPGA code is received and/or otherwise retrieved. In some examples, the FPGA code retriever 214 acquires FPGA code, such as the example FPGA pipelined loop nest 100 of FIG. 1, from the example FPGA code storage 206 via the example network 204 or the example bus 212. In response to obtaining the FPGA code, the example loop detector 216 identifies for-loops of the pipeline loop code 100 (block 704) and determines whether the identified for-loop is nested (block 706). If the for-loop is nested (block 706), then the example loop detector 216 identifies the for-loop as a pipelined loop nest (block 708), such as the example double-nested for-loop 106 of FIG. 1. Otherwise, the example loop detector 216 identifies the for-loop as one of an initialization loop or a finalization loop (block 710). The example loop detector 216 determines whether there are additional for-loops within the example pipeline loop code 100 that have not yet been analyzed (block 712). If so, control returns to block 704. If not, the example loop detector 216 identifies a register shift inner loop of the identified pipelined loop nest (block 714).

The example unroller 222 unrolls the register shift inner loop (block 716) as described above and in further detail below. The example intermediate canceller 224 cancels out intermediate loads and stores to retain a last shifted value (block 718). The example propagator 226 generates code to propagate the retained values as a scalar loop for input to a vectorizer (block 720). The example DEFs/USEs eliminator 228 eliminates DEFs and USEs associated with the register shift inner loop (block 722) as described above and in further detail below. The example SIMD code generator 218 generates CPU SIMD code to be emulated by a target CPU (block 724), and the example vectorizer invoker 220 invokes a vectorizer using the generated scalar SIMD code (block 726).

FIG. 8 illustrates additional detail associated with unrolling the register shift inner loop (block 716) of FIG. 7. In the illustrated example of FIG. 8, the example pipeline size identifier 230 identifies a pipeline size (block 802). As described above, in some examples the pipeline size identifier 230 determines the pipeline size by searching and/or otherwise parsing the example pipeline loop code 100 for a #define directive and a corresponding value. The example pipeline shifter 234 generates a temporary unroll array to store shift results for each pipeline stage (block 804), and the example pipeline stage selector 232 selects a pipeline stage (block 806). The example pipeline shifter 234 loads a corresponding register element of the selected pipeline stage (block 808), and the example pipeline shifter 234 shifts and stores the corresponding element in a direction of FPGA pipeline code to the temporary unroll array (block 810).

The example pipeline stage selector 232 determines if there are additional iterations in the selected pipeline stage (block 812) and, if so, control returns to block 808 to load a next register element. Otherwise, the example pipeline stage selector 232 determines whether there are additional pipeline stages based on the identified pipeline size (block 814). If so, then control returns to block 806 to select a next pipeline stage. Otherwise, the example program 716 returns to block 718 of FIG. 7.

FIG. 9 illustrates additional detail of eliminating DEFs and USEs of block 722 of FIG. 7. In the illustrated example of FIG. 9, the example loop detector 216 locates the register shift loop (block 902), and the example DEFS/USEs identifier 236 identifies DEFs and USEs associated with the identified register shift loop (block 904). As described above, the register shift loop of the example pipeline loop code 100 exhibits substantial computational burdens for CPU target emulation that is caused by numerous iterations of data-dependency parameters (DEFs and USEs). The example DEFs/USEs identifier 236 parses the FPGA pipelined loop nest 100 for an instance of the identified DEF (block 906), and when it is located (block 908), the example instance remover 238 removes the identified DEF (block 910). Additionally, the example DEFs/USEs identifier 236 parses the FPGA pipelined loop nest 100 for an instance of a corresponding USE of the DEF (block 912), and when it is located (block 914), the example instance remover 238 removes the identified USE (block 916). The example loop detector 216 determines if the example pipelined loop nest 100 has been fully examined and/or otherwise parsed (block 918). If not, control returns to block 906 to continue parsing for instances of USEs and/or DEFs that may still reside in the example pipelined loop nest 100. Otherwise, the program 722 returns to block 724 of FIG. 7.

Figure 10:
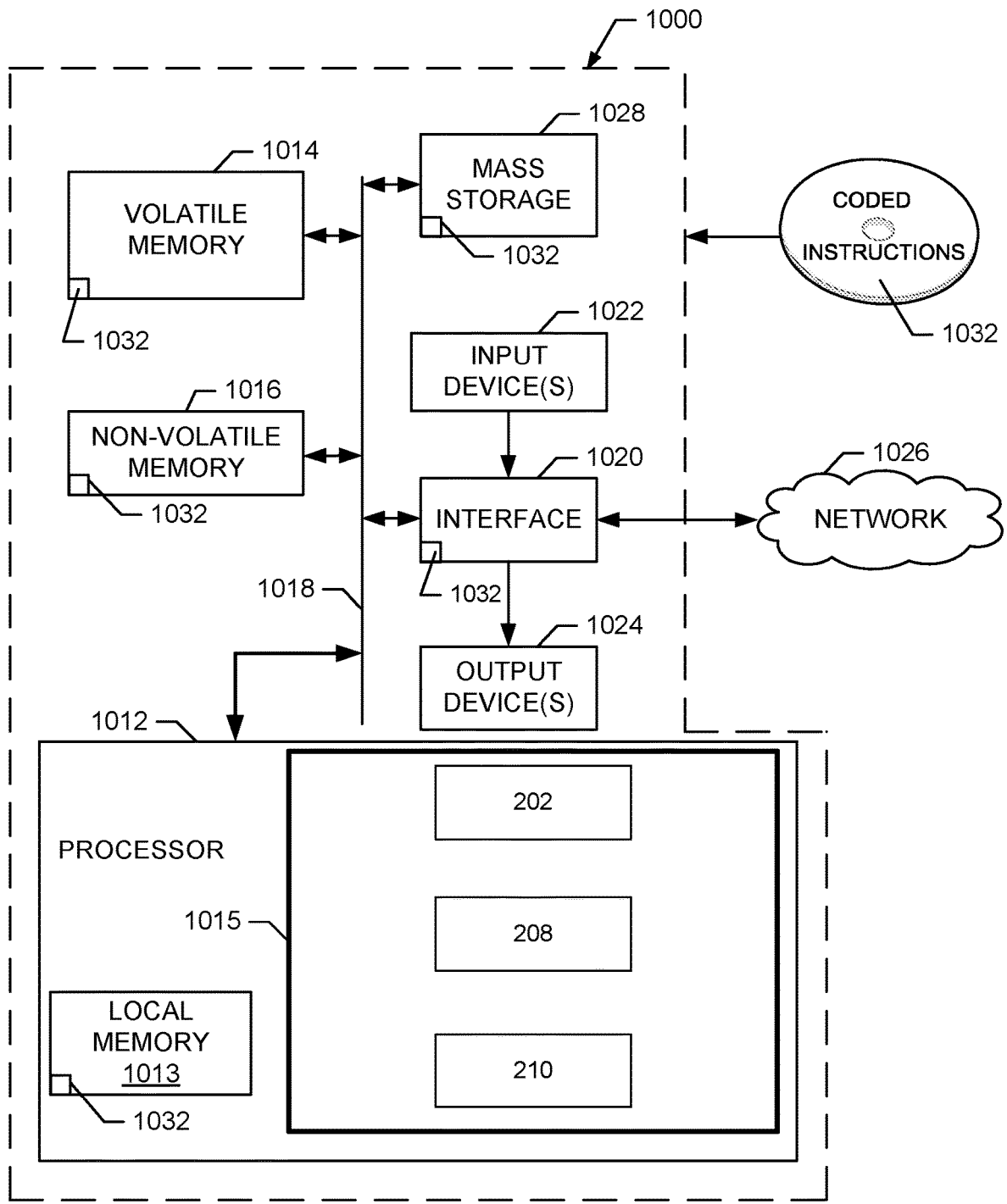
FIG. 10 is a block diagram of an example processor platform structured to execute the example machine readable instructions of FIGS. 7-9 to implement the example emulation optimization environment of FIG. 2.

FIG. 10 is a block diagram of an example processor platform 1000 capable of executing the instructions of FIGS. 7-9 to implement the emulation optimization environment 200 of FIG. 2. The processor platform 1000 can be, for example, a server, a personal computer, a mobile device (e.g., a cell phone, a smart phone, a tablet such as an iPad™), a personal digital assistant (PDA), an Internet appliance, a gaming console, a set top box, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors or controllers from any desired family or manufacturer. The hardware processor may be a semiconductor based (e.g., silicon based) device. In this example, the processor 1012 implements the example emulation optimizer 202, the example compiler 208 and/or the example vectorization system 210. In the illustrated example of FIG. 10, the processor 1012 includes one or more example processing cores 1015 configured via example instructions 1032, which include the example instructions of FIGS. 7-9.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

The coded instructions 1032 of FIGS. 7-9 may be stored in the mass storage device 1028, in the volatile memory 1014, in the non-volatile memory 1016, and/or on a removable tangible computer readable storage medium such as a CD or DVD.

From the foregoing, it will be appreciated that example methods, apparatus, systems and articles of manufacture have been disclosed that improve FPGA pipeline emulation efficiency on CPUs. Examples disclosed herein eliminate computationally burdensome initialization loops, buffer shifting loops and/or drain-out loops from FPGA code that allow non-FPGA targets, such as CPUs, to perform emulation in a more efficient manner. Additionally, examples disclosed herein identify data-dependency parameters that would otherwise burden CPU targets when performing emulation.

Example methods, systems, apparatus and articles of manufacture to improve FPGA pipeline emulation efficiency on CPUs are disclosed herein. Some such examples and combinations thereof include the following.

Example 1 is an apparatus to improve emulation efficiency, the apparatus including a loop detector to identify a register shift loop in field programmable gate array (FPGA) code, an unroller to shift and store pipeline stages in the register shift loop to a temporary unroll array, an intermediate canceller to cancel out intermediate load and store values of the temporary unroll array to retain last shifted values of the pipeline stages, and a propagator to improve emulation efficiency of the FPGA code by generating a scalar loop of the retained last shifted values for a vectorization input.

Example 2 includes the apparatus as defined in example 1, wherein the loop detector is to identify the register shift loop by detecting an instance of a double-nested for-loop in the FPGA code.

Example 3 includes the apparatus as defined in example 1, further including a pipeline size identifier to determine a number of pipeline stages of the FPGA code, wherein the determined number of pipeline stages of the FPGA code is to determine a size of the temporary unroll array.

Example 4 includes the apparatus as defined in example 1, further including a DEFs/USEs identifier to identify data-dependency parameters associated with the register shift loop.

Example 5 includes the apparatus as defined in example 4, further including an instance remover to remove the data-dependency parameters from the register shift loop.

Example 6 includes the apparatus as defined in example 4, wherein the DEFs/USEs identifier is to determine whether the data-dependency parameters associated with the register shift loop are located in at least one other loop of the FPGA code.

Example 7 includes the apparatus as defined in example 6, further including an instance remover to remove the data-dependency parameters from at least one of a pipeline buffer initialization loop or a pipeline drain-out loop.

Example 8 includes the apparatus as defined in example 1, further including a single instruction multiple data (SIMD) code generator to generate target code for a target processor, the target code to remove for-loops associated with data-dependency parameters associated with FPGA pipeline register shifting by the target processor.

Example 9 includes the apparatus as defined in any one of examples 1-8, wherein the propagator is to generate the scalar loop for a target central processing unit (CPU) capable of multi-way parallelization.

Example 10 includes the apparatus as defined in any one of examples 1-8, further including a vectorizer invoker to invoke a vectorization system with the vectorization input to enable multi-way parallelism of a central processing unit (CPU).

Example 11 includes the apparatus as defined in any one of examples 1-8, further including an FPGA code retriever to retrieve the FPGA code from an FPGA code storage.

Example 12 is a computer-implemented method to improve emulation efficiency, the method including identifying, by executing a computer instruction by a processor, a register shift loop in field programmable gate array (FPGA) code, shifting and storing, by executing a computer instruction by the processor, pipeline stages in the register shift loop to a temporary unroll array, cancelling out, by executing a computer instruction by the processor, intermediate load and store values of the temporary unroll array to retain last shifted values of the pipeline stages, and improving emulation efficiency, by executing a computer instruction by the processor, by generating a scalar loop of the retained last shifted values for a vectorization input.

Example 13 includes the method as defined in example 12, further including identifying the register shift loop by detecting an instance of a double-nested for-loop in the FPGA code.

Example 14 includes the method as defined in example 12, further including determining a number of pipeline stages of the FPGA code, wherein the determined number of pipeline stages of the FPGA code is to determine a size of the temporary unroll array.

Example 15 includes the method as defined in example 12, further including identifying data-dependency parameters associated with the register shift loop.

Example 16 includes the method as defined in example 15, further including removing the data-dependency parameters from the register shift loop.

Example 17 includes the method as defined in example 15, further including determining whether the data-dependency parameters associated with the register shift loop are located in at least one other loop of the FPGA code.

Example 18 includes the method as defined in example 17, further including removing the data-dependency parameters from at least one of a pipeline buffer initialization loop or a pipeline drain-out loop.

Example 19 includes the method as defined in example 12, further including generating target code for a target processor, the target code to remove for-loops associated with data-dependency parameters associated with FPGA pipeline register shifting by the target processor.

Example 20 includes the method as defined in any one of examples 12-19, further including generating the scalar loop for a target central processing unit (CPU) capable of multi-way parallelization.

Example 21 includes the method as defined in any one of examples 12-19, further including invoking a vectorization system with the vectorization input to enable multi-way parallelism of a central processing unit (CPU).

Example 22 includes the method as defined in any one of examples 12-19, further including retrieving the FPGA code from an FPGA code storage.

Example 23 is a non-transitory computer-readable medium including instructions that, when executed, cause one or more processors to, at least identify a register shift loop in field programmable gate array (FPGA) code, shift and store pipeline stages in the register shift loop to a temporary unroll array, cancel out intermediate load and store values of the temporary unroll array to retain last shifted values of the pipeline stages, and improve emulation efficiency of the FPGA code by generating a scalar loop of the retained last shifted values for a vectorization input.

Example 24 includes the computer-readable medium as defined in example 23, wherein the instructions, when executed, further cause the one or more processors to identify the register shift loop by detecting an instance of a double-nested for-loop in the FPGA code.

Example 25 includes the computer-readable medium as defined in example 23, wherein the instructions, when executed, further cause the one or more processors to determine a number of pipeline stages of the FPGA code, wherein the determined number of pipeline stages of the FPGA code is to determine a size of the temporary unroll array.

Example 26 includes the computer-readable medium as defined in example 23, wherein the instructions, when executed, further cause the one or more processors to identify data-dependency parameters associated with the register shift loop.

Example 27 includes the computer-readable medium as defined in example 26, wherein the instructions, when executed, further cause the one or more processors to remove the data-dependency parameters from the register shift loop.

Example 28 includes the computer-readable medium as defined in example 26, wherein the instructions, when executed, further cause the one or more processors to determine whether the data-dependency parameters associated with the register shift loop are located in at least one other loop of the FPGA code.

Example 29 includes the computer-readable medium as defined in example 28, wherein the instructions, when executed, further cause the one or more processors to remove the data-dependency parameters from at least one of a pipeline buffer initialization loop or a pipeline drain-out loop.

Example 30 includes the computer-readable medium as defined in example 23, wherein the instructions, when executed, further cause the one or more processors to generate target code for a target processor, the target code to remove for-loops associated with data-dependency parameters associated with FPGA pipeline register shifting by the target processor.

Example 31 includes the computer-readable medium as defined in any one of examples 23-30, wherein the instructions, when executed, further cause the one or more processors to generate the scalar loop for a target central processing unit (CPU) capable of multi-way parallelization.

Example 32 includes the computer-readable medium as defined in any one of examples 23-30, wherein the instructions, when executed, further cause the one or more processors to invoke a vectorization system with the vectorization input to enable multi-way parallelism of a central processing unit (CPU).

Example 33 includes the computer-readable medium as defined in any one of examples 23-30, wherein the instructions, when executed, further cause the one or more processors to retrieve the FPGA code from an FPGA code storage.

Example 34 is a system to improve emulation efficiency, the system including means for identifying a register shift loop in field programmable gate array (FPGA) code, means for shifting and storing pipeline stages in the register shift loop to a temporary unroll array, means for cancelling out intermediate load and store values of the temporary unroll array to retain last shifted values of the pipeline stages, and means for improving emulation efficiency of the FPGA code by generating a scalar loop of the retained last shifted values for a vectorization input.

Example 35 includes the system as defined in example 34, further including means for identifying the register shift loop by detecting an instance of a double-nested for-loop in the FPGA code.

Example 36 includes the system as defined in example 34, further including means for determining a number of pipeline stages of the FPGA code, wherein the determined number of pipeline stages of the FPGA code is to determine a size of the temporary unroll array.

Example 37 includes the system as defined in example 34, further including means for identifying data-dependency parameters associated with the register shift loop.

Example 38 includes the system as defined in example 37, further including means for removing the data-dependency parameters from the register shift loop.

Example 39 includes the system as defined in example 37, further including means for determining whether the data-dependency parameters associated with the register shift loop are located in at least one other loop of the FPGA code.

Example 40 includes the system as defined in example 39, further including means for removing the data-dependency parameters from at least one of a pipeline buffer initialization loop or a pipeline drain-out loop.

Example 41 includes the system as defined in example 34, further including means for generating target code for a target processor, the target code to remove for-loops associated with data-dependency parameters associated with FPGA pipeline register shifting by the target processor.

Example 42 includes the system as defined in examples 34-41, further including means for generating the scalar loop for a target central processing unit (CPU) capable of multi-way parallelization.

Example 43 includes the system as defined in examples 34-41, further including means for invoking a vectorization system with the vectorization input to enable multi-way parallelism of a central processing unit (CPU).

Example 44 includes the system as defined in examples 34-41, further including means for retrieving the FPGA code from an FPGA code storage.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to improve emulation efficiency, the apparatus comprising:
   a processor;
   a loop detector, implemented by the processor, to identify a register shift loop in field programmable gate array (FPGA) code;
   an unroller, implemented by the processor, to shift and store pipeline stages in the register shift loop to a temporary unroll array;
   an intermediate canceller, implemented by the processor, to cancel out intermediate load and store values of the temporary unroll array to retain last shifted values of the pipeline stages;
   a propagator, implemented by the processor, to improve emulation efficiency of the FPGA code by generating a scalar loop of the retained last shifted values for a vectorization input; and
   a pipeline size identifier, implemented by the processor, to determine a number of pipeline stages of the FPGA code, wherein the determined number of pipeline stages of the FPGA code is to determine a size of the temporary unroll array.

2. The apparatus as defined in claim 1, wherein the loop detector is to identify the register shift loop by detecting an instance of a double-nested for-loop in the FPGA code.

3. The apparatus as defined in claim 1, further including a definitions/uses (DEFs)/(USEs) identifier to identify data-dependency parameters associated with the register shift loop.

4. The apparatus as defined in claim 3, further including an instance remover to remove the data-dependency parameters from the register shift loop.

5. The apparatus as defined in claim 3, wherein the DEFs/USEs identifier is to determine whether the data-dependency parameters associated with the register shift loop are located in at least one other loop of the FPGA code.

6. An apparatus to improve emulation efficiency, the apparatus comprising:
   a processor;
   a loop detector, implemented by the processor, to identify a register shift loop in field programmable gate array (FPGA) code;
   an unroller, implemented by the processor, to shift and store pipeline stages in the register shift loop to a temporary unroll array;
   an intermediate canceller, implemented by the processor, to cancel out intermediate load and store values of the temporary unroll array to retain last shifted values of the pipeline stages; and
   a propagator, implemented by the processor, to improve emulation efficiency of the FPGA code by generating a scalar loop of the retained last shifted values for a vectorization input;
   a definitions/uses (DEFs)/(USEs) identifier, implemented by the processor, to:
      identify data-dependency parameters associated with the register shift loop; and
      determine whether the data-dependency parameters associated with the register shift loop are located in at least one other loop of the FPGA code; and
   an instance remover, implemented by the processor, to remove the data-dependency parameters from at least one of a pipeline buffer initialization loop or a pipeline drain-out loop.

7. The apparatus as defined in claim 1, further including a single instruction multiple data (SIMD) code generator to generate target code for a target processor, the target code to remove for-loops associated with data-dependency parameters associated with FPGA pipeline register shifting of the target processor.

8. A computer-implemented method to improve emulation efficiency, the method comprising:
   identifying, by executing a computer instruction by a processor, a register shift loop in field programmable gate array (FPGA) code;
   shifting and storing, by executing a computer instruction by the processor, pipeline stages in the register shift loop to a temporary unroll array;
   cancelling out, by executing a computer instruction by the processor, intermediate load and store values of the temporary unroll array to retain last shifted values of the pipeline stages;
   improving emulation efficiency of the FPGA code, by executing a computer instruction by the processor, by generating a scalar loop of the retained last shifted values for a vectorization input; and
   determining a number of pipeline stages of the FPGA code, wherein the determined number of pipeline stages of the FPGA code is to determine a size of the temporary unroll array.

9. The method as defined in claim 8, further including identifying the register shift loop by detecting an instance of a double-nested for-loop in the FPGA code.

10. The method as defined in claim 8, further including identifying data-dependency parameters associated with the register shift loop.

11. The method as defined in claim 10, further including removing the data-dependency parameters from the register shift loop.

12. The method as defined in claim 10, further including determining whether the data-dependency parameters associated with the register shift loop are located in at least one other loop of the FPGA code.

13. The method as defined in claim 8, further including generating target code for a target processor, the target code to remove for-loops associated with data-dependency parameters associated with FPGA pipeline register shifting by the target processor.

14. A computer-implemented method to improve emulation efficiency, the method comprising:

identifying, by executing a computer instruction by a processor, a register shift loop in field programmable gate array (FPGA) code;

shifting and storing, by executing a computer instruction by the processor, pipeline stages in the register shift loop to a temporary unroll array;

cancelling out, by executing a computer instruction by the processor, intermediate load and store values of the temporary unroll array to retain last shifted values of the pipeline stages;

improving emulation efficiency of the FPGA code, by executing a computer instruction by the processor, by generating a scalar loop of the retained last shifted values for a vectorization input;

identifying data-dependency parameters associated with the register shift loop;

determining whether the data-dependency parameters associated with the register shift loop are located in at least one other loop of the FPGA code; and removing the data-dependency parameters from at least one of a pipeline buffer initialization loop or a pipeline drain-out loop.

15. A non-transitory computer-readable medium comprising instructions that, when executed, cause one or more processors to, at least:

identify a register shift loop in field programmable gate array (FPGA) code;

shift and store pipeline stages in the register shift loop to a temporary unroll array;

cancel out intermediate load and store values of the temporary unroll array to retain last shifted values of the pipeline stages;

improve emulation efficiency of the FPGA code by generating a scalar loop of the retained last shifted values for a vectorization input; and determine a number of pipeline stages of the FPGA code, wherein the determined number of pipeline stages of the FPGA code is to determine a size of the temporary unroll array.

16. The computer-readable medium as defined in claim 15, wherein the instructions, when executed, further cause the one or more processors to identify the register shift loop by detecting an instance of a double-nested for-loop in the FPGA code.

17. The computer-readable medium as defined in claim 15, wherein the instructions, when executed, further cause the one or more processors to identify data-dependency parameters associated with the register shift loop.

18. The computer-readable medium as defined in claim 17, wherein the instructions, when executed, further cause the one or more processors to remove the data-dependency parameters from the register shift loop.

19. The computer-readable medium as defined in claim 17, wherein the instructions, when executed, further cause the one or more processors to determine whether the data-dependency parameters associated with the register shift loop are located in at least one other loop of the FPGA code.

20. The computer-readable medium as defined in claim 15, wherein the instructions, when executed, further cause the one or more processors to generate target code for a target processor, the target code to remove for-loops associated with data-dependency parameters associated with FPGA pipeline register shifting by the target processor.

21. A non-transitory computer-readable medium comprising instructions that, when executed, cause one or more processors to, at least:

identify a register shift loop in field programmable gate array (FPGA) code;

shift and store pipeline stages in the register shift loop to a temporary unroll array;

cancel out intermediate load and store values of the temporary unroll array to retain last shifted values of the pipeline stages;

improve emulation efficiency of the FPGA code by generating a scalar loop of the retained last shifted values for a vectorization input;

identify data-dependency parameters associated with the register shift loop;

determine whether the data-dependency parameters associated with the register shift loop are located in at least one other loop of the FPGA code; and remove the data-dependency parameters from at least one of a pipeline buffer initialization loop or a pipeline drain-out loop.

* * * * *